(12) United States Patent
Arvin et al.

(10) Patent No.: US 10,777,482 B2
(45) Date of Patent: Sep. 15, 2020

(54) MULTIPART LID FOR A SEMICONDUCTOR PACKAGE WITH MULTIPLE COMPONENTS

(71) Applicant: ELPIS TECHNOLOGIES INC., Ottawa (CA)

(72) Inventors: Charles L. Arvin, Poughkeepsie, NY (US); Steven P. Ostrander, Poughkeepsie, NY (US); Krishna R. Tunga, Wappingers Falls, NY (US)

(73) Assignee: ELPIS TECHNOLOGIES INC., Ottawa, Ontario (CA)

( * ) Notice: Subject to any disclaimer, the term of this patent is extended or adjusted under 35 U.S.C. 154(b) by 0 days.

(21) Appl. No.: 16/404,949

(22) Filed: May 7, 2019

(65) Prior Publication Data

US 2019/0259683 A1     Aug. 22, 2019

Related U.S. Application Data

(63) Continuation of application No. 15/826,856, filed on Nov. 30, 2017, now Pat. No. 10,325,830.

(51) Int. Cl.
*H01L 23/367* (2006.01)
*H01L 23/373* (2006.01)
(Continued)

(52) U.S. Cl.
CPC ........ *H01L 23/3675* (2013.01); *F28F 21/085* (2013.01); *F28F 21/087* (2013.01);
(Continued)

(58) Field of Classification Search
CPC ............. H01L 23/3675; H01L 23/3736; H01L 21/4882; H01L 2924/14; H01L 23/10; F28F 21/085; F28F 21/087; F28F 21/089
See application file for complete search history.

(56) References Cited

U.S. PATENT DOCUMENTS 6,292,369 B1   9/2001   Daves et al.
6,294,408 B1   9/2001   Edwards et al.
(Continued)

FOREIGN PATENT DOCUMENTS

JP     2013539226 B2   10/2013

OTHER PUBLICATIONS

Zang et al., "Failure Analysis of Thermal Degradation of TIM during Power Cycling", 2014 IEEE Intersociety Conference on Thermal and Thermomechanical Phenomena in Electronic Systems (ITherm), May 27-30, 2014, Orlando, FL, USA, pp. 404-408.
(Continued)

*Primary Examiner* — Patricia D Reddington
(74) *Attorney, Agent, or Firm* — Shin Hung; VanTek IP LLP

(57) ABSTRACT

A multipart lid is provided. The multipart lid may include a formed upper lid designed for maximum heat dissipation, a coined lower lid joined to the formed upper lid, where the coined lower lid comprises a coefficient of thermal expansion (CTE) substantially equal to a CTE of a first semiconductor component. A structure is provided. The structure may include a substrate, a first semiconductor component electrically connected and mounted on the substrate, one or more discrete components electrically connected and mounted on the substrate, a substrate mounted multipart lid covering both the semiconductor component and the one or more discrete components, where the multipart lid comprises a heat dissipating upper lid and a lower lid, where a coefficient of thermal expansion (CTE) of the lower lid substantially matches a CTE of the first semiconductor component.

20 Claims, 6 Drawing Sheets

SECTION B-B

(51) Int. Cl.
*H01L 21/48* (2006.01)
*F28F 21/08* (2006.01)
*H01L 23/42* (2006.01)
*H01L 23/10* (2006.01)

(52) U.S. Cl.
CPC ........ *F28F 21/089* (2013.01); *H01L 21/4882* (2013.01); *H01L 23/3736* (2013.01); *F28F 2265/26* (2013.01); *H01L 23/10* (2013.01); *H01L 23/42* (2013.01); *H01L 2924/14* (2013.01)

(56) References Cited

U.S. PATENT DOCUMENTS

| | | | | |
|---|---|---|---|---|
| 6,611,054 | B1* | 8/2003 | Dunaway | H01L 23/06 257/660 |
| 6,949,404 | B1* | 9/2005 | Fritz | H01L 23/3675 438/106 |
| 7,851,906 | B2 | 12/2010 | Alcoe et al. | |
| 8,053,284 | B2 | 11/2011 | Iruvanti et al. | |
| 8,659,169 | B2 | 2/2014 | Mardi et al. | |
| 9,018,040 | B2 | 4/2015 | Lamorey et al. | |
| 9,093,563 | B2 | 7/2015 | Blackshear et al. | |
| 9,192,070 | B2 | 11/2015 | Tan et al. | |
| 9,496,194 | B2 | 11/2016 | Arvelo et al. | |
| 2004/0150097 | A1 | 8/2004 | Gaynes et al. | |
| 2005/0269665 | A1 | 12/2005 | Wylie | |
| 2013/0299131 | A1 | 11/2013 | Timashov et al. | |
| 2015/0001701 | A1 | 1/2015 | Li | |
| 2016/0229685 | A1* | 8/2016 | Boysel | B81B 7/007 |
| 2017/0162542 | A1* | 6/2017 | Chen | H01L 23/3672 |

OTHER PUBLICATIONS

Arvin, "Multipart Lid for a Semiconductor Package With Multiple Components", Pending U.S. Appl. No. 15/826,856, filed Nov. 20, 2017, pp. 1-29.

IBM: List of IBM Patents or Patent Applications Treated As Related (Appendix P), Feb. 5, 2020, pp. 1-2.

* cited by examiner

SECTION A-A

SECTION B-B

SECTION C-C

MULTIPART LID FOR A SEMICONDUCTOR PACKAGE WITH MULTIPLE COMPONENTS

BACKGROUND

The present invention generally relates to semiconductor packaging, and more particularly to semiconductor lids.

Semiconductor packaging may use a lid covering an integrated circuit which is mounted on a substrate or a laminate. The integrated circuit may be mounted on the laminate via a flip chip ball grid array which provides electrical connection to the laminate which has external electronic connections. With increased performance of integrated circuits, an increasing number of decoupling capacitors, and other components are required to fit within a same surface area under the lid. Required tolerances for the lid are increasingly difficult to obtain using coining due to the increased number of components under the lid. Using machining as an alternative method of lid manufacturing may result in burs and protrusions, which may affect an optimal thermal contact with the integrated circuit under the lid, and also has higher cost implications.

SUMMARY

According to an embodiment of the present invention, a multipart lid is provided. The multipart lid may include a formed upper lid designed for maximum heat dissipation, a coined lower lid joined to the formed upper lid, where the coined lower lid comprises a coefficient of thermal expansion (CTE) substantially equal to a CTE of a first semiconductor component.

According to another embodiment, a structure is provided. The structure may include a substrate, a first semiconductor component electrically connected and mounted on the substrate, one or more discrete components electrically connected and mounted on the substrate, a substrate mounted multipart lid covering both the semiconductor component and the one or more discrete components, where the multipart lid comprises a heat dissipating upper lid and a lower lid, where a coefficient of thermal expansion (CTE) of the lower lid substantially matches a CTE of the first semiconductor component.

According to another embodiment, a method of fabricating a structure, the method including forming a formed upper lid, where the formed upper lid comprises heat dissipation capabilities, forming a coined lower lid, where the coined lower lid comprises a coefficient of thermal expansion (CTE) substantially matching a CTE of a first semiconductor component, forming a multipart lid by joining the formed upper lid and the coined lower lid, covering both the first semiconductor component mounted on a substrate and one or more discrete components mounted on the substrate by mounting the multipart lid on the substrate.

BRIEF DESCRIPTION OF THE DRAWINGS

The following detailed description, given by way of example and not intended to limit the invention solely thereto, will best be appreciated in conjunction with the accompanying drawings, in which.

Figure 1:
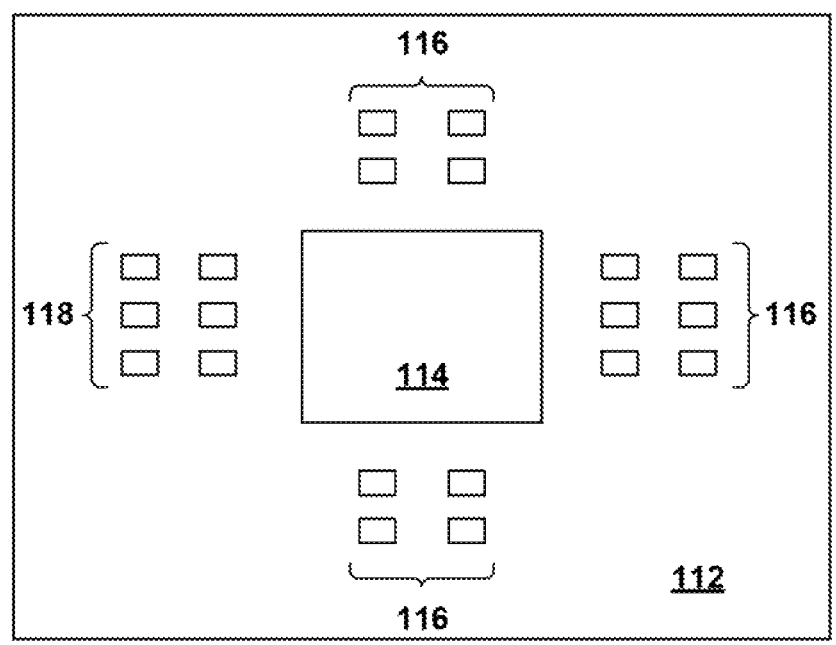
FIG. 1 is a top view of a structure, according to an exemplary embodiment.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, required tolerances of a lid covering multiple components are increasingly difficult to obtain using conventional coining techniques due to the increased number of components under the lid. Closer tolerances may be achieved using reductive manufacturing techniques, such as, for example, computerized numerical control (CNC) machining; however, such techniques are typically more costly.

Lids are commonly manufactured from copper due to thermal benefits. In comparison, lids fabricated from nickel may result in a 10° Celsius rise in temperature of an integrated circuit under the lid, which would adversely affect performance of the integrated circuit. In other cases, copper lids can be nickel plated to prevent corrosion and improve aesthetics. Nickel plating may further improve adhesion of any thermal interface material used to facilitate heat transfer.

Traditionally, lids are either formed or coined. Formed lids are manufactured from a thin sheet of copper that is plastically shaped to generate a recess surrounded by a flange. The flange is bonded directly to the substrate while the recess accommodates any integrated circuits and discrete components mounted on the surface of the substrate. Coined lids are manufactured from a thicker piece of copper in which a cavity is embossed (or coined) to make a space for any integrated circuits and discrete components mounted on the surface of the substrate.

Formed lids are commonly used for lower-performance, cost-sensitive package applications. Although formed lids require less raw material and undergo a relatively simple manufacturing process, they are not rigid nor can they transfer heat as well as coined lids. The lack of rigidity in a formed lid can further negatively affect thermal performance by allowing the thermal interface between the integrated circuit and the lid to fail during thermal cycling.

Coined lids are typically utilized in high-performance, high-power package applications. Coined lids require more copper raw material compared to formed lids, and require a relatively more complicated manufacturing process including multiple stage sequential coining or embossing. In general, due to the amount of material, coined lids function as a better heat sink than formed lids. Additionally, the shape of the coined cavity can be specifically engineered to optimize fit and thermal performance of the package. The lid is designed to balance thermal performance and mechanical performance to optimize package reliability. Package reliability includes reliability of all components within the package.

For example, mechanical strain or tearing of thermal interface material between the integrated circuit and the lid affect mechanical performance of the package, while thermos-mechanical strains imparted on the integrated circuit may affect device wiring reliability. Lateral spacing between an edge of the integrated circuit and the lid, which is mechanically bonded to the substrate, becomes a key variable balancing thermal performance with mechanical performance. Closer spacing tends to increase thermal-performance, but increases the possibility of a physical collision between the integrated circuit and the lid thus risking mechanical performance.

As demands for computation power evolve to support big data, machine learning, artificial intelligence and cognitive computing, among other requirements, demands on processor performance and/or power also increase. Cooling solutions once reserved for high end server applications may become utilized in more main stream data centers, high performance computing and graphic processing unit applications. These applications will require high performance attributes of the lid, for example, better thermal performance and improved package reliability. Further, it is expected that additional components such as discrete components and secondary integrated circuits, will need to be populated within the package under the lid for these emerging applications.

These additional components may be preferably placed in close proximity to the integrated circuit to minimize signal latency. Additionally, discrete components such as inductors and resistors may be placed in close proximity to the integrated circuit to minimize detrimental electrical parasitics. The components may compete for space on the substrate which is critical for optimization of thermal performance versus package reliability of the integrated circuit. For example, they may compete for the space formerly reserved for the critical inner edge of the lid flange. As a compromise, an underside of the lid could be customized to allocate space for both additional devices and discrete components but maintain an optimized spacing between the integrated circuit and the lid for optimal package reliability.

Requirements for the integrated circuit and the additional components may not be met with the traditional coined lid as required geometries and their tolerances potentially exceed manufacturability capability of a coining or embossing process. Currently a tolerance for a coined lid may be a few tens of microns. Future requirements may include a tolerance of less than 1.0 um and possibly even 0.1 um for some advanced modules.

A method and structure of a multipart lid design to enable multiple component placement is described in detail below by referring to the accompanying drawings in FIGS. 1-10, in accordance with an illustrative embodiment.

In the present embodiment, the multipart lid may include two or more parts which can be fabricated separately and joined for use as a module lid for a semiconductor package having multiple components. The multipart lid may meet design requirements for increasing an amount of components under the lid. The multipart lid may exceed the thermal and package reliability performance of a coined lid, allow a high degree of complex precision personalized inner cavity geometry, and reduce manufacturing complexity. A reduction in manufacturing complexity may result in a more cost-effective lid. The multipart lid provides an opportunity to separate functionality requirements of a lid top section and functionality requirements of a lid bottom or flange section. For example, a top part of the multipart lid can be designed to optimize thermal performance while a bottom part of the multipart lid can be designed to optimize mechanical performance which may increase package reliability overall.

Referring to FIG. 1, a top view of a structure 100 is shown, according to an exemplary embodiment. The structure 100 may include a substrate 112, an integrated circuit 114, and one or more discrete components 116, 118. The substrate 112, also known as a carrier, may be a ceramic substrate, a composite substrate, or a laminate substrate. In an embodiment, the substrate 112 is an organic laminate substrate. Laminate substrates may be very similar to printed circuit boards in that similar materials and build processes are used; however, laminate substrates may have significantly higher per-layer wiring densities. Laminate substrates may be preferable for their relatively lower cost and increased electrical performance due to the use of copper conductors and lower-dielectric-constant insulator materials. For example, the substrate 112 may include four epoxy-glass-reinforced copper layers jacketed by four unreinforced build-up dielectric layers on each side. In many cases, the copper layers of the substrate 112 will include one or more thick full metal layers referred to as power planes and thinner sub-planes referred to as power islands.

The integrated circuit 114 may also be referred to as a chip, a die, a die stack, an electronic component, a component, an electronic device, or a semiconductor device, among other things. The integrated circuit 114 may include a logic chip, a voltage reference device, a digital signal processor, a microprocessor, a microcontroller, a graphics processor, a memory device, a memory cube, a booting device, a radio frequency device, a high band width memory device, or any other semiconductor device. There may be more than one integrated circuits 114 on the structure 100.

The integrated circuit 114 may be electrically and physically connected to the substrate 112 using a plurality of solder connections. A typical joining sequence to create the solder connections may begin with depositing or applying a plurality of solder balls on a plurality of bonding pads on the integrated circuit 114. The plurality of solder balls are then heated to a temperature sufficient to cause them to reflow. Next, the integrated circuit 114, including the plurality of solder balls, is aligned to and placed on a package site on the substrate 112. In doing so, the plurality of solder balls contacts a corresponding plurality of bonding pads on the substrate 112. The plurality of solder balls is again heated to a temperature sufficient to cause them to reflow, creating solder connections. The solder connections may electrically connect and physically join the integrated circuit 114 to the substrate 112. An example of the solder connections includes controlled collapse chip connection (also known as C4 or flip-chip connection). The semiconductor packages which use the solder balls as mentioned above may also be referred to as ball grid array, flip chip, and other known names.

The discrete components 116, 118 may each be a capacitor, a resistor, a transistor, a diode, or other discrete devices. The discrete components 116, 118 are electrically and physically connected to the substrate 112 according to known techniques, for example, using a solder reflow process. For purposes of the present disclosure the discrete components 118 are taller than the discrete components 116.

The integrated circuit 114 is generally smaller than the substrate 112 to which it is attached. For example, in an embodiment, the integrated circuit 110 may be approximately 75 mm×100 mm, and the substrate 112 may be approximately 500 mm×1000 mm.

Figure 2:
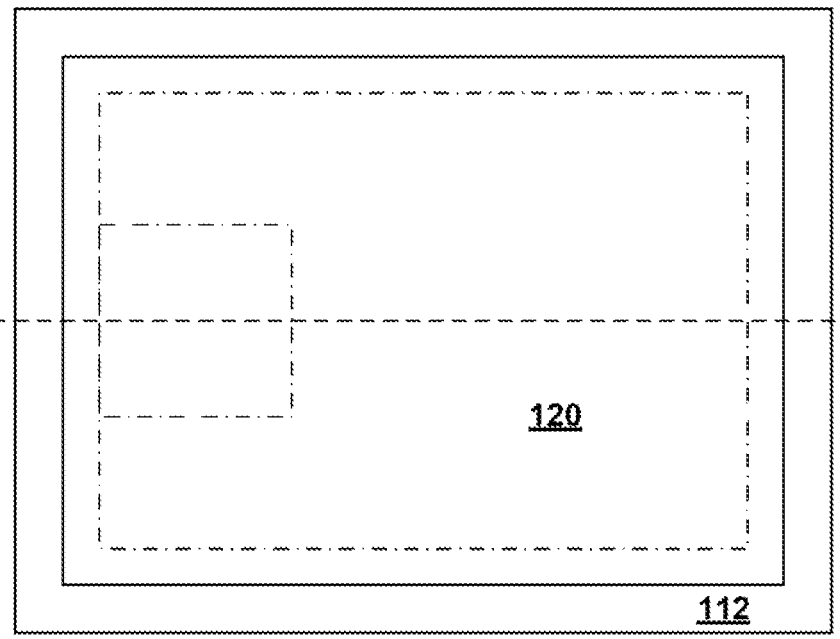
FIG. 2 is a top view of a package structure, according to an exemplary embodiment.
Figure 3:
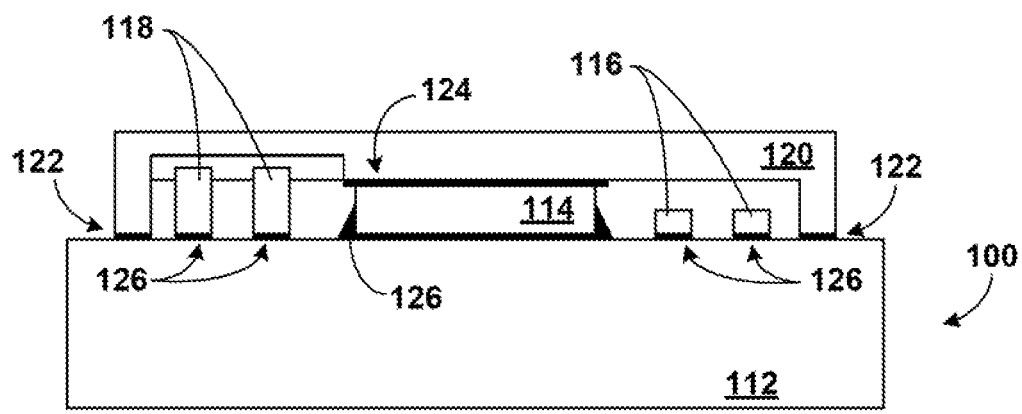
FIG. 3 is a cross section view of FIG. 2 taken along section line A-A, according to an exemplary embodiment.

Referring to FIGS. 2 and 3, a package 200 is shown, according to an exemplary embodiment. FIG. 2 is a top view of the package 200 while FIG. 3 is a cross section view of FIG. 2 taken along section line A-A. The package 200 may also be referred to as a semiconductor package or a module. The package 200 may include the structure 100 and a lid 120. The lid 120 is secured to the structure to cover and protect a portion of the substrate 112, the integrated circuit 114, and the discrete components 116, 118.

Specifically, the lid 120 is secured to a top surface of the substrate 112. In some cases, the lid 120 may have a flange around its perimeter used for securing the lid 120 to the top surface of the substrate 112. The lid 120 may be physically attached or secured to the top surface of the substrate 112 using a sealant 122 applied directly to a top surface of the substrate 112, or alternatively applied to a bottom surface of the lid 120, along the flange. The lid 120 may generally be secured to the substrate 112 only along an outside perimeter of the lid 120, generally in a rectangular outline of lid 120 (see FIG. 6). The sealant 122 may include any known epoxy suitable to provide mechanical stiffness and resist warpage of the package 200, such as, for example, sylgard 577 or EA6700. In order to conduct heat away from the integrated circuit 114, a thermal interface material 124 is typically applied either to an inner top surface of the lid 120 or directly to the top surface of the integrated circuit 114 to fill a space between the integrated circuit 114 and the lid 120. The thermal interface material 124 is used to create a thermal connection between the integrated circuit 114 and the lid 120 for purposes of transferring heat away from the integrated circuit 114. In an embodiment, the thermal interface material 124 may include TIM1.

The lid 120 may generally be made from a metal which provides adequate thermal conductivity and sufficient rigidity to achieve thermal and mechanical performance goals. The size and shape of the lid 120 is specifically designed not to contact the integrated circuit 114 or any of the discrete components 116, 118.

Before securing the lid 120, an underfill 126 may be applied between the substrate 112 and the integrated circuit 114, and between the substrate 112 and the discrete components 116, 118. The underfill 126 may be applied after the integrated circuit and discrete components are physically and electrically joined to the substrate 112. The underfill 126 may be applied to a bottom edge of each component and is drawn under the components by capillary action to fill open spaces between solder connections. The underfill 126 may provide additional mechanical support and strengthen the connections between each component and the substrate 112. In an embodiment, the underfill 126 may include Sumitomo 4160G. As shown in FIG. 3, the underfill 126 may extend from under the integrated circuit 114 and partially up a side of the integrated circuit 114.

An inner top surface of the lid 120 may generally be at a height slightly above a height of the integrated circuit 114 mounted on the substrate 112, with enough space for the thermal interface material 124. The inner top surface of the lid 120 may have a cutout, or cavity, in an area above any of the discrete components to accommodate their additional height. In some cases, the lid 120 may have a cavity in an area corresponding to the integrated circuit 114 to accommodate its height. As shown in FIG. 3, for example, the one or more tall discrete components 118 are taller than the integrated circuit 114. Accordingly, the lid 120 in FIG. 3 has a cavity corresponding with the one or more tall discrete components 118. Additionally, for example, the discrete components 116 are shorter than the integrated circuit 114, thus typically do not require a separate cavity. Preferably, a space remains above the more discrete components 116, 118 to prevent contact between the lid 120 and the discrete components 116, 118.

In addition to providing physical protection, the lid 120 may also serve a heat transfer function by conducting heat from the integrated circuit 114 during operation. In many instances, a heat sink (not shown) is commonly attached to an exterior surface of the lid 120 to further assist with transferring heat away from the integrated circuit 114. It should be noted that, while the embodiment depicted in the figures includes one integrated circuit 114, any number of integrated circuits may be included in the package 200, which may increase the need for additional heat transfer capabilities. In an embodiment, the lid 120 may be any material that provides good thermal conduction, mechanical stiffness and physical protection to the underlying components, such as, for example, nickel plated copper, anodized aluminum, a ceramic, or any other suitable material.

The various components of the package 200 described above may each have a different coefficient of thermal expansion (CTE). For example, the substrate 112 may have a CTE approximately seven times that of the integrated circuit 114, and the integrated circuit 114 and the substrate 112 may together have a combined CTE of approximately four to five times that of the lid 120. For example, in an embodiment, the integrated circuit 114 may have a CTE of about 2 to 3 ppm/° C. while the substrate 112 may have an average CTE of about 25 ppm/° C. Additional examples of CTEs for relevant materials is included below in table 1. The difference between CTEs of the various components of the package 200 may alternatively be described as a CTE mismatch.

TABLE 1

Exemplary Coefficients of Thermal Expansion

| Material | CTE (ppm/° C.) |
|---|---|
| Silicon | 2.7 |
| Alumina | 6 to 7 |
| Copper | 16.7 |
| Tin-lead Solder | 27 |
| E-glass | 54 |
| S-glass | 16 |
| Epoxy resins | 15-100 |
| Silicon Resins | 30-300 |

Heating cycles during operation, may result in undesirable stress of the package 200 as a result of the CTE mismatch, as described above. During operation, the substrate 112 may expand up to seven times greater than the expansion of the integrated circuit 114 as a result of the CTE mismatch between the two components. The CTE mismatch between the substrate 112 and the integrated circuit 114 will typically cause undesirable failures in the substrate 112 or the electrical connections between the integrated circuit 114 and the substrate 112. The CTE mismatch between the substrate 112 and the integrated circuit 114 can also cause undesirable and unpredictable warping of the package 200. The package 200 will typically experience hundreds if not thousands of heating/cooling cycles during operation.

Potential points of failure for the package 200 due to handling and heating may include peeling of the thermal interface material 124 between the inner top surface of the lid 120 and the top surface of the integrated circuit 114. Peeling of the thermal interface material 124 may occur due to a protrusion or a bur as a result of machining the lid 120, or due to the lid 120 beginning to lift or separate from the substrate 112 due to warping from heat cycling.

An additional point of failure for the package 200 may include delamination of the underfill 126 at a corner of the integrated circuit 114 also cause by thermal cycling. The delamination of the underfill 126 may occur due to shear stress at the corner of the integrated circuit 114 and the substrate 112. Shear stress may occur due to the CTE mismatch between the substrate 112, the integrated circuit 114 and the lid 120.

A further point of failure for the package 200 may include failure of the discrete components 116, 118 caused by thermal cycling. Failure of the discrete components 116, 118 can occur due to solder plastic work/cycle damage, which is a fatigue element of plastic deformation vs brittle deformation, due to the discrete components including both plastic material and being soldered to the substrate 112, due to the CTE mismatch between the plastic material and the solder and the substrate 112.

Figure 4:
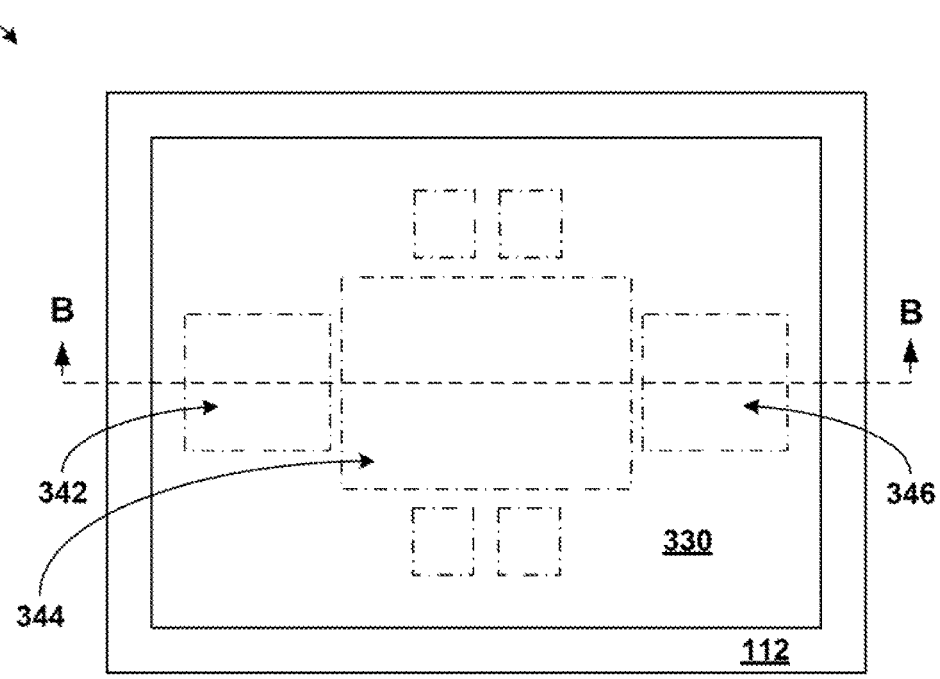
FIG. 4 is a top view of a new package structure, according to an exemplary embodiment.
Figure 5:
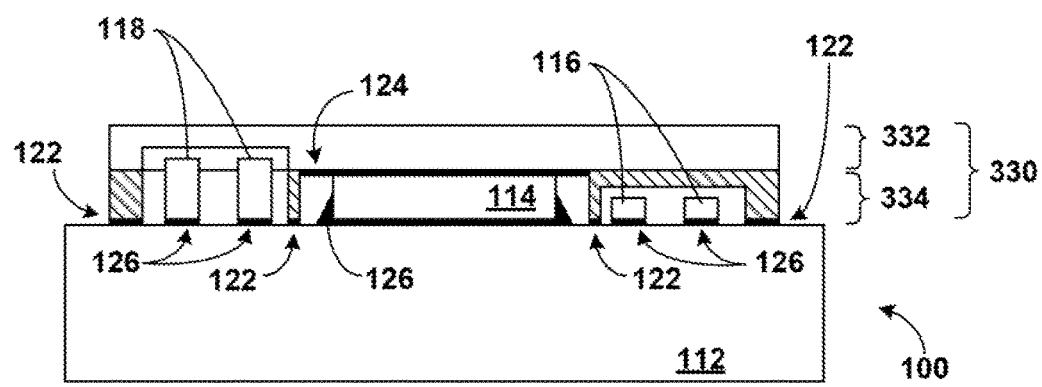
FIG. 5 is a cross section view of FIG. 4 taken along section line B-B, according to an exemplary embodiment.

Referring to FIGS. 4 and 5, a new package 300 is shown, according to an exemplary embodiment. FIG. 4 is a top view of the package 300 while FIG. 5 is a cross section view of FIG. 4 taken along section line B-B. The package 300 may be substantially similar to the package 200 described above; however, with a new multipart lid 330.

Similar to the package 200 described above, the package 300 includes the substrate 112, a multipart lid 330, the integrated circuit 114, and the discrete components 116, 118, assembled with the thermal interface material 124, and the underfill 126. Unlike the lid 120, described above, the multipart lid 330 includes multiple components or parts. In the present embodiment, the multipart lid 330 includes an upper part 332 joined to a lower part 334, as is described in more detail below. Manufacturing the lid from multiple parts allows designers the ability to separate thermal performance from mechanical performance. With the multipart lid design, thermal performance can now be optimized without affecting mechanical performance, and vice versa, therefore allowing further advancements in package reliability. The multipart lid design will allow packaging engineers to balance thermal performance with mechanical performance to achieve optimal package reliability. Specifically, the upper part 332 and the lower part 334 can be individually designed with unique features and fabricated from different materials. For example, the upper part 332 can be designed and made from a material to optimize heat transfer, while the lower part 334 can be designed and made from a material to optimize mechanical rigidity.

With continued reference to FIGS. 4 and 5, the multipart lid 330 of the present embodiment is designed such that a height or thickness of the lower part 334 is driven by a height of the integrated circuit 114. For example, a height or thickness of the lower part 334 of the multipart 330 lid is equal to a height of the integrated circuit 114 plus a thickness of the thermal interface material 124. The multipart lid 330 also includes at least a first cavity 342, a second cavity 344, and a third cavity 346. Each cavity 342, 344, 346 is designed specifically to accommodate the shape and size of the various components of the structure 100, for example, the integrated circuit 114 and the discrete components 116, 118. It should be noted that the first cavity 342 extends through the lower part 334 of the multipart lid 330 and into the upper part 332 of the multipart lid 330. Although a limited number of cavities are shown and described, the multipart lid 330 can be designed with any number of cavities to suit the requirements of any package design. For illustrative purposes only, additional cavities are illustrated in FIG. 4. Unlike the lid 120, the multipart lid 330 includes multiple individualized cavities each having a customized shape and size to accommodate the various components of the structure 100, respectively.

In the present example, the first cavity 342 corresponds to the one or more tall discrete components 118. As shown in FIG. 5, the first cavity 342 extends through the lower part 334 of the multipart lid 330 and partially into the upper part 332 of the multipart lid 330. In the present example, the discrete components 118 are taller than the integrated circuit 114, and taller than the discrete components 116, as measured from an upper surface of the substrate 112. Therefore, because of the cavities of the multipart lid 330 are individually customizable, only the first cavity 342 needs to extend into a portion of the upper part 332 of the multipart lid 330. The second cavity 344 corresponds to the integrated circuit 114. As shown in FIG. 5, the second cavity 344 only extends through the lower part 334 of the multipart lid 330. The third cavity 346 corresponds to the short discrete components 116. As shown in FIG. 5, the third cavity 346 only extends partially into the lower part 334 of the multipart lid 330. Therefore, each of the cavities 342, 344, 346 have a different height (or depth), which corresponds to a height of each of the tall discrete components 118, the integrate circuit 114, and the short discrete components 116, respectively. Furthermore, each of the cavities 342, 344, 346 have a different size and shape, which corresponds to the size and shape of one or more of each of the tall discrete components 118, the integrate circuit 114, and the short discrete components 116, respectively.

Spacing requirement of the various components of the structure 100 often differ from one component to the next. The customized cavities of the multipart lid 330 allow packaging engineers to individually tailor spacing between the multipart lid 330 and each of the various components of the structure 100, to further improve performance and reliability. For example, spacing between the integrated circuit 114 and the multipart lid 330, reserved for the thermal interface material 124, no longer dictates a spacing between the discrete components 116, 118 and the multipart lid 330.

To optimize thermal performance of the package 300, the upper part 332 of the multipart lid 330 may be made from a material with superior heat transfer properties, and may be made from a different material than that of the lower part 334. Additionally, as described above, the multipart lid 330 of the present embodiment is designed such that the thermal interface material 124 is in direct contact with both the integrated circuit 114 and the upper part 332 of the multipart lid 330 to maximize heat transfer. As illustrated, the upper part 332 of the multipart lid 330 has a uniform thickness. In an embodiment, a heat sink may be secured to a top surface of the upper part 332 to further improve heat transfer. In an alternative embodiment, the upper part 332 may include cooling fins integrated into its upper surface to further improve heat transfer. In an embodiment, the upper part 332 is made from copper and can be nickel plated to prevent corrosion and improve aesthetics, amongst other known advantages. In such an embodiment, the upper part 332 may preferably be nickel plated prior to being joined to the lower part 334. In an embodiment, the upper part 332 may be formed.

In contrast, to optimize physical performance of the package 300, the lower part 334 of the multipart lid 330 may be made from a different material with superior mechanical properties, and may be made from a different material than that of the upper part 332. Specifically, the material of the lower part 334 may be chosen to minimize the CTE mismatch between the lower part 334, the substrate 112, and the various component attached thereon. As such, the lower part 334 of the multipart lid 330 may have a different CTE than the upper part 332. The material of the lower part 334 of the multipart lid 330 may be tailored to more closely match a CTE of the substrate 112 and a CTE of the components under the multipart lid 330 in order to minimize warping and reduce the risk of mechanical failure. In some cases, the CTE of the lower part 334 closely matches an average CTE of the substrate 112 and the components 116, 118.

By tailoring the material of the lower part 334 based on the CTE of components 116, 118 and the substrate 112, less movement between the lower part 334 and the components may occur due to thermal cycling. Reducing or controlling the CTE mismatch between the multipart lid 330 and the structure 100 will limit mechanical failure of the solder connections, the underfill 126, and the thermal interface material 124.

The lower part 334 may include metal, ceramic, organic material, an oxide, and nickel iron (NiFe). In a preferred embodiment, the lower part 334 may include a nickel iron alloy having a CTE selected from as low as 1.2 with a 36% nickel concentration, to a CTE approaching 20 with approximate 20% nickel concentration. In an embodiment, the lower part 334 can also be plated with nickel, for known advantages described above as well as improve adhesion of the sealant 122. Like with the upper part 332, the lower part 334 may be nickel plated prior to being joined with the upper part 332. In an alternate embodiment, the multipart lid 330 can be nickel plated after the lower part 334 is joined to the upper part 332. Plating may be done with nickel phosphorus (NiP), nickel boron (NiB) or electrolytic nickel.

In an embodiment, the lower part 334 may be cut, or stamped, from a flat sheet of material with cavities, or openings, needed to accommodate the various components of the structure 100. Alternatively, the lower part 334 can be manufactured using any known techniques, such as, for example, stamping, coining, machining, or the like. Unlike the lid 120 described above, the lower part 334 of the multipart lid 330 more closely follows a topology of the various components of the structure 100. Doing so allows packaging engineers to accommodate different sized components and optimize spacing around such components. As described above, some cavities will extend through the lower part 334, for example the first cavity 342 and the second cavity 344, while other cavities will only extend into a portion of the lower part 334, for example the third cavity 346.

According to an alternative embodiment, the lower part 334 may include one or more pieces. In such embodiments, the one or more pieces of the lower part 334 may each have a different CTE and each are joined to the upper part 332 to form the multipart lid 330. The smaller pieces of the lower part 334 may each have a CTE matching a CTE of an adjacent component. For example, one piece of the lower part 334 may have a CTE matching or similar to that of the integrated circuit 114, while another piece of the lower part 334 may have a CTE matching or similar to that of the discrete components 116, 118.

After each of the upper part 332 and the lower part 334 are manufactured, they are joined together. In doing so, the upper part 332 may need to be aligned with the lower part 334. According to the present example, the upper part 332 and the lower part 334 will need to be aligned to form the first cavity 342. In some embodiments, the cavities may only exist in the lower part 334, and no alignment would be required to form the cavities.

The upper part 332 and the lower part 334 may be joined together by any known technique to maintain a balance between thermal performance and mechanical performance of the multipart lid 330. The upper part 332 and the lower part 334 may be joined together using an adhesive, solder, pressure, or brazing, among other methods. The upper part 332 may be physically attached or secured to a top surface of the lower part 334 using a sealant, for example the sealant 122, applied directly to a top surface of the lower part 334, or alternatively applied to a bottom surface of the upper part 332. In an embodiment, the one or more pieces of the lower part 334 may be aligned using a fixture or physically placing the one or more pieces of the lower part 334 onto the upper part 332. In such embodiments, the one or more pieces of the lower part 334 may be joined using an adhesive, solder, pressure, or brazing, among other methods. In an embodiment, a length and a width of the upper part 332 may be the same as a length and a width of the lower part 334, however they are not required to be the same. In an embodiment, the upper part 332 is joined to the lower part 334 before the multipart lid 330 is secured to the substrate 112. In an alternative embodiment, the upper part 332 is joined to the lower part 334 after the lower part 334 has been secured to the substrate 112.

Like the lid 120, the multipart lid 330 is physically attached or secured to the top surface of the substrate 112 using the sealant 122 applied directly to a top surface of the substrate 112, or alternatively applied to a bottom surface of the multipart lid 330. Unlike the lid 120, the sealant 122 is not only applied along an outside perimeter but instead across an entire bottom surface of the lower part 334 of the multipart lid 330 (see FIG. 7).

In sum, the package 300 is more reliable than the package 200 as a result of the new multipart lid 330. Specifically, the upper part 332 and the lower part 334 are fabricated separately each from a different material to balance thermal performance with mechanical performance, therefore improving the package 300 reliability. The multipart lid 330 has the following advantages over the lid 120: improved package reliability, reduced CTE mismatch between the lid and the substrate, reduced mechanical strain, and optimized spacing between the lid and each component on the substrate. It may be noted that not all advantages of the present invention are included above.

Figure 6:
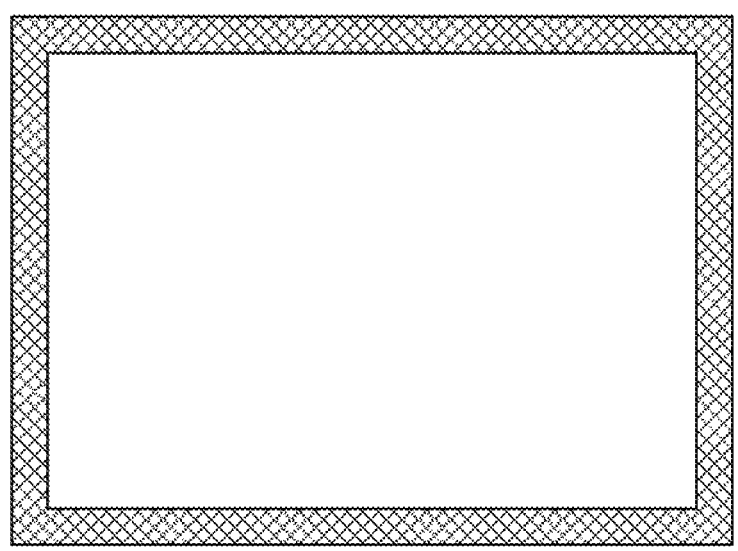
FIG. 6 illustrates a contact area between a lid and a substrate of the package shown in FIGS. 2 and 3, according to an exemplary embodiment.
Figure 7:
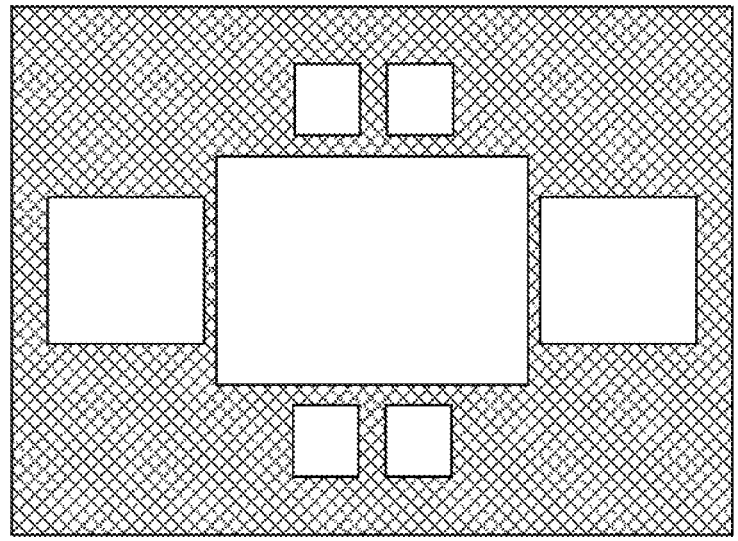
FIG. 7 illustrates a contact area between a lid and a substrate of the new package shown in FIGS. 4 and 5, according to an exemplary embodiment.

Referring to FIGS. 6 and 7, contact area 121 between the substrate 112 and the lid 120 is shown along with contact area 331 between the substrate 112 and the multipart lid 330. Due to the unique design to of the multipart lid 330, the lower part 334 has substantially more contact area with the substrate 112 than the lid 120. As a result, the multipart lid 330 will provide substantially more mechanical support than the lid 120, and the package 300 will be substantially stiffer and more capable of resisting warping than the package 200. The stiffer package results in less strain on the components, the solder connections, and the underfill 126, thereby improving mechanical performance. Additionally, the substantially larger contact area and stiffer package also prevents tearing of the thermal interface material 124, thereby maintaining adequate thermal performance. Packages with the multipart lid 330 are expected to have a substantially lower failure rate than packages with the lid 120.

Figure 8:
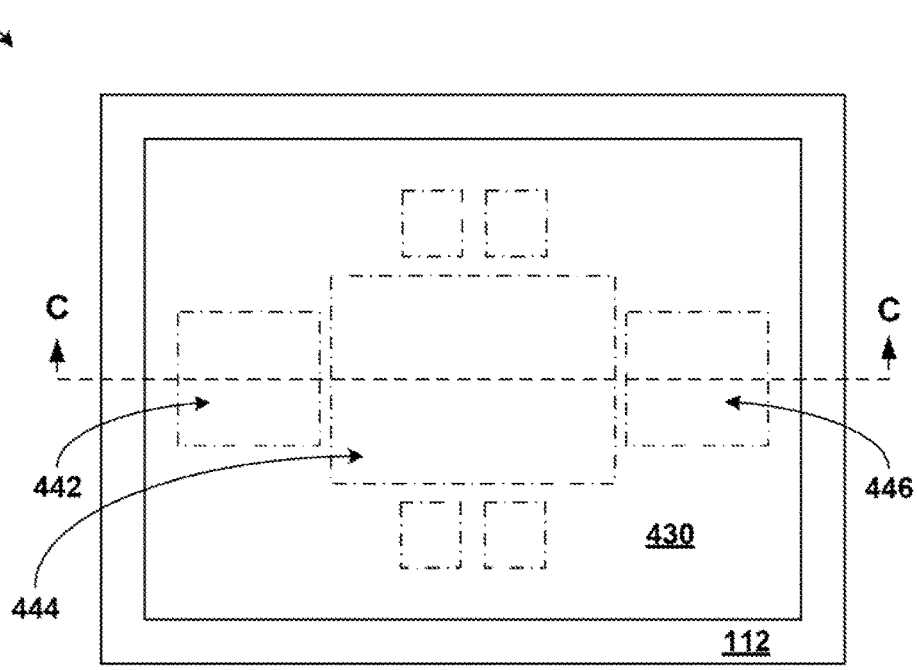
FIG. 8 is a top view of a new package structure, according to another exemplary embodiment.
Figure 9:
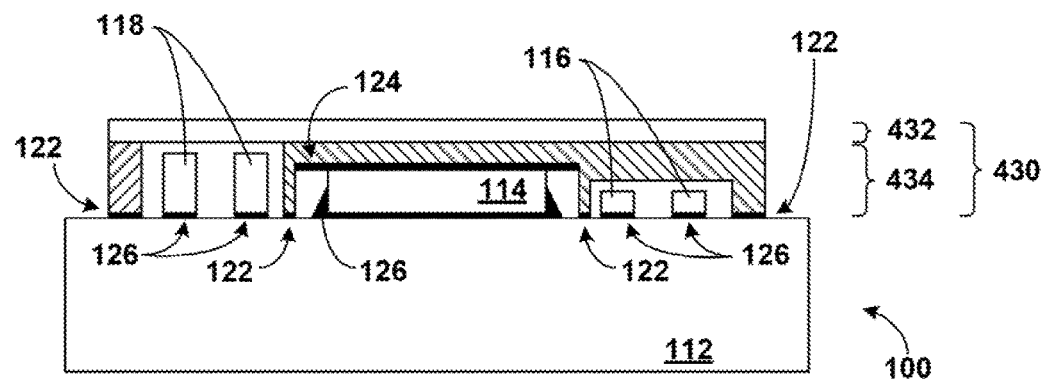
FIG. 9 is a cross section view of FIG. 8 taken along section line C-C, according to another exemplary embodiment.

Referring to FIGS. 8 and 9, a new package 400 is shown, according to another exemplary embodiment. FIG. 8 is a top view of the package 400 while FIG. 9 is a cross section view of FIG. 8 taken along section line C-C. The package 400 may be substantially similar to the package 300 described above; however, with a new multipart lid 430. Like the package 300 described above, the package 400 includes the substrate 112, a multipart lid 430, the integrated circuit 114, and the discrete components 116, 118 assembled with the thermal interface material 124, and the underfill 126. The multipart lid 430 includes a lower part 434 and an upper part 436. Unlike the package 300 described above, the multipart lid 430 has a different configuration than the multipart lid 330.

The multipart lid 430 of the present embodiment is designed such that a height or thickness of the lower part 434 is driven by a height of the tall discrete components 118, rather than the integrated circuit 114 in the multipart lid 330. For example, a height or thickness of the lower part 434 of the multipart 430 lid is equal to a height of the tall discrete components 118 plus a thickness of any desired spacing require above such components. In such cases, only a first cavity 442 will extend through the lower part 434 of the multipart lid 430 and a second cavity 444 and a third cavity 446 only extends partially into the lower part 434 of the multipart lid 430.

Alternatively, the multipart lid 430 can also be designed such that a height or thickness of the lower part 434 is driven by a height of the short discrete components 116. For example, a height or thickness of the lower part 434 of the multipart 430 lid may be equal to a height of the short discrete components 116 plus a thickness of any desired spacing require above such components. In such cases, a first cavity 442 and a second cavity 444 will extend through the lower part 434 of the multipart lid 430 partially into the upper part 432 of the multipart lid 430, and only the third cavity 446 extends partially into the lower part 434 of the multipart lid 430.

Figure 10:
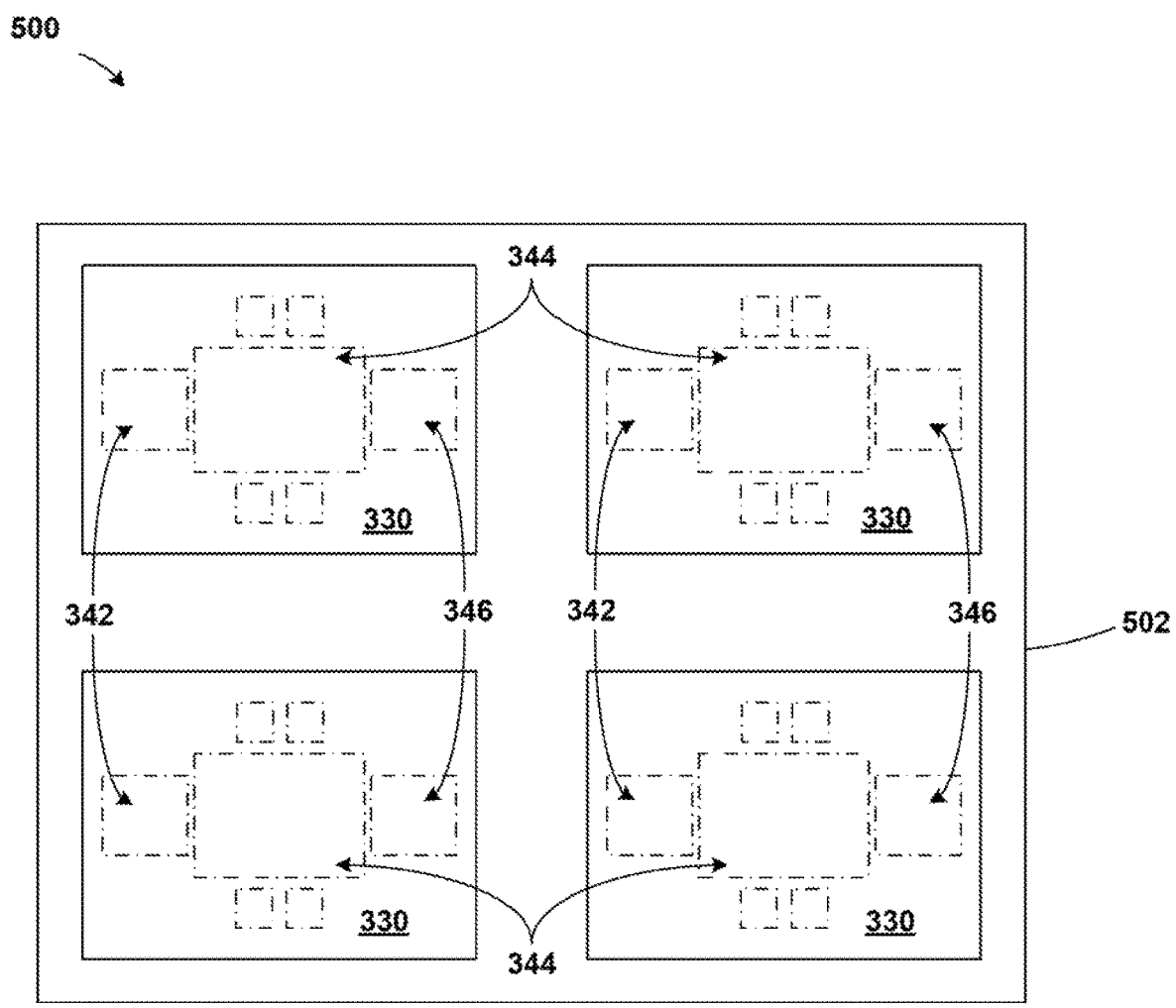
FIG. 10 is a top view of an alternative package structure, according to another exemplary embodiment.

Referring to FIG. 10, a new structure 500 is shown. The structure 500 may include four multipart lids 330. Each of the multipart lids 330 may cover a grouping of components, for example, each of the multipart lids 330 may include a first cavity 342, a second cavity 344 and a third cavity 346. As described above in the description of FIGS. 4 and 5, each cavity 342, 344, 346 is designed specifically to accommodate the shape and size of a component of the grouping of components, for example, the integrated circuit 114 and the discrete components 116, 118, all mounted on a substrate 502. For illustrative purposes only, additional cavities are illustrated in FIG. 100.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A multipart lid comprising:
   an upper part, wherein the upper part is cube shaped with a first cavity extending partially into the upper part from a bottom surface of the upper part; and
   a lower part comprising two or more pieces each having different coefficients of thermal expansion,
   wherein an upper surface of the lower part is joined to the bottom surface the upper part,
   wherein the upper part and lower part comprise different coefficients of thermal expansion,
   wherein at least one piece of the lower part comprises a coefficient of thermal expansion substantially equal to a coefficient of thermal expansion of an integrated circuit, wherein a second cavity in the lower part corresponds to a size and shape of the integrated circuit, and wherein a height of the integrated circuit above a substrate is equal to or less than a height of the lower part above the substrate.

2. The multipart lid according to claim 1, wherein the upper part comprises copper, wherein a plating of the upper part comprises nickel.

3. The multipart lid according to claim 1, wherein a top surface of the integrated circuit contacts an uppermost surface of the first cavity.

4. The multipart lid according to claim 1, wherein the lower part comprises a nickel iron alloy, wherein a plating of the lower part comprises nickel.

5. The multipart lid according to claim 1, further comprising:
one or more additional cavities extending partially into the lower part from a bottom surface of the lower part, wherein each of the one or more additional cavities corresponds to a size and shape of an electronic component.

6. The multipart lid according to claim 1,
wherein at least one piece of the lower part comprises a coefficient of thermal expansion substantially equal to a coefficient of thermal expansion of one or more electronic components.

7. A multipart lid comprising:
an upper part, wherein the upper part is cube shaped with a first rectangular cavity extending partially into the upper part from a bottom surface of the upper part; and
a lower part comprising two or more pieces each having different coefficients of thermal expansion,
wherein an upper surface of the lower part is joined to the bottom surface the upper part,
wherein the upper part and lower part comprise different coefficients of thermal expansion,
wherein at least one piece of the lower part comprises a coefficient of thermal expansion substantially equal to a coefficient of thermal expansion of an integrated circuit,
wherein a second cavity in the lower part corresponds to a size and shape of the integrated circuit and aligns with the first cavity in the upper part, and
wherein a height of the integrated circuit above a substrate is greater than a height of the lower part above the substrate.

8. The multipart lid according to claim 7, wherein the lower part comprises a third cavity, wherein the third cavity corresponds to a size and shape of a discrete component, wherein a height of the discrete component is equal to or less than to a height of the lower part.

9. The multipart lid according to claim 7, wherein the upper part comprises copper, wherein a plating of the upper part comprises nickel.

10. The multipart lid according to claim 7, a top surface of the integrated circuit contacts an uppermost surface of the first cavity.

11. The multipart lid according to claim 7, wherein the lower part comprises a nickel iron alloy, wherein a plating of the lower part comprises nickel.

12. The multipart lid according to claim 7, further comprising:
wherein the lower part comprises a third cavity, wherein the third cavity corresponds to a size and shape of a discrete component, wherein a height of the discrete component is greater than to a height of the lower part.

13. The multipart lid according to claim 7,
wherein at least one piece of the lower part comprises a coefficient of thermal expansion substantially equal to a coefficient of thermal expansion of a discrete component.

14. A structure comprising:
a multipart lid covering an integrated component and one or more discrete components mounted on a substrate, wherein the multipart lid comprises an upper part and a lower part comprising two or more pieces each having different coefficients of thermal expansion, wherein the upper part and lower part comprise different coefficients of thermal expansion,
wherein at least one piece of the lower part comprises a coefficient of thermal expansion substantially equal to an average of both the coefficient of thermal expansion of the integrated component and the coefficient of thermal expansion of the substrate,
wherein the coefficient of thermal expansion of the integrated component is 3 ppm/° C., and the coefficient of thermal expansion of the substrate is 25 ppm/° C.,
wherein a bottom surface of the multipart lid comprises a first cavity corresponding to the integrated component, and one or more second cavities, each of the one or more second cavities corresponding to the one or more discrete components,
wherein a height of the integrated component above the substrate is greater than a height of the lower part above the substrate, and
wherein a height above the substrate of a first one of the one or more discrete components is equal to or less than to a height above the substrate of the lower part.

15. The structure according to claim 14, wherein the upper part comprises copper, wherein a plating of the upper part comprises nickel.

16. The structure according to claim 14, wherein a top surface of the integrated component contacts an uppermost surface of the first cavity.

17. The structure according to claim 14, wherein the lower part comprises a nickel iron alloy, wherein a plating of the lower part comprises nickel.

18. The structure according to claim 14, wherein each of the one or more second cavities correspond to a size and shape of an electronic component, wherein each of the one or more second cavities partially extends into the lower part from a bottom surface of the lower part.

19. The structure according to claim 14, wherein a height of at least one of the one or more discrete components is greater than a height of the lower part above the substrate.

20. The structure according to claim 14,
wherein at least one piece of the lower part comprises a coefficient of thermal expansion substantially equal to a coefficient of thermal expansion of the one or more discrete components.

* * * * *